United States Patent
Schmidt et al.

(10) Patent No.: US 8,290,726 B2
(45) Date of Patent: Oct. 16, 2012

(54) PHOTOCONDUCTIVE PHOTODIODE BUILT-IN TEST (BIT)

(75) Inventors: Richard A. Schmidt, Tucson, AZ (US); Mitchell O. Perley, Charlestown, MA (US); Robert A. Kuehn, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 203 days.

(21) Appl. No.: 12/769,461

(22) Filed: Apr. 28, 2010

(65) Prior Publication Data

US 2011/0270543 A1    Nov. 3, 2011

(51) Int. Cl.
 *G01R 31/00* (2006.01)
 *G06F 11/30* (2006.01)
(52) U.S. Cl. ............. 702/58; 702/60; 702/182; 702/183
(58) Field of Classification Search ............. 702/58–63, 702/121–123, 179–189
See application file for complete search history.

(56) References Cited

U.S. PATENT DOCUMENTS

| 4,437,060 A * | 3/1984 | Ferenczi et al. ......... 324/762.07 |
| 7,233,258 B1 * | 6/2007 | Gelinas ........................ 340/907 |
| 2010/0066375 A1 | 3/2010 | Hente et al. |

FOREIGN PATENT DOCUMENTS

DE    102004049906 A1    5/2006

* cited by examiner

*Primary Examiner* — Phuong Huynh
(74) *Attorney, Agent, or Firm* — Eric A. Gifford (57) ABSTRACT

A Built-In Test (BIT) for a photoconductive photodiode is performed using the health or characteristics of the photodiode's parasitic capacitance as a "proxy" for the health or characteristics of the photodiode itself. A failure or degradation of the photodiode manifests as a similar failure or degradation of the parasitic capacitance. Under normal operating conditions, the photoconductive photodiode responds to incident photons from a target by generating a photocurrent signal at its cathode. A processor processes the signals from one or more photodiodes to evaluate characteristics of the target. To perform the BIT, a time-varying voltage signal is applied at the photodiode's anode. This signal is coupled through the parasitic capacitance to produce a test current signal at the photodiode's anode. The processor processes the signal to evaluate the health or characteristics of the parasitic capacitance and thus the photodiode.

20 Claims, 6 Drawing Sheets

PHOTOCONDUCTIVE PHOTODIODE BUILT-IN TEST (BIT)

BACKGROUND OF THE INVENTION

1. Field of the Invention

This invention relates to a system and method for performance of a Built-In Test (BIT) for a photoconductive photodiode such as may be used in a semi-active laser (SAL) seeker.

2. Description of the Related Art

A photodiode is a type of photodetector capable of converting light into either current or voltage, depending upon the mode of operation. Photodiodes are similar to regular semiconductor diodes except they are packaged either for direct exposure to light or packaged with a window or optical fiber connected to allow light to reach the sensitive part of the device. Photodiodes may detect light in from the UV band of approximately 0.3 microns to the LWIR band of approximately 12 microns.

A photodiode is a PN junction or PIN structure. When a photon of sufficient energy strikes the diode, the photon excites an electron, thereby creating a mobile electron a positive charged electron hole. If the absorption occurs in the junction's depletion region, or within one diffusion length of the depletion region, these carriers are swept away from the junction by the built-in field of the depletion region. Thus holes move toward the anode and electrons towards the cathode and a photocurrent is produced.

Reverse biasing the photodiode causes it to operate in the photoconductive mode. The reverse bias increases the width of the depletion region, which decreases the junction's capacitance resulting in faster response time. The reverse bias induces a small amount of current (known as saturation or back current) along its direction while the photocurrent remains virtually the same. The photocurrent is linearly proportional to the incident light. In the photoconductive mode, the photodiode converts light at its anode into photocurrent at its cathode.

One use of photoconductive photodiodes is within semi-active laser (SAL) seekers to detect pulsed laser electromagnetic radiation (EMR) scattered from an intended target to provide signals indicative of target bearing to guide a projectile (e.g. laser guided artillery shell, guided missile or guided bomb) to the target. The SAL may include an optical system to capture and focus the scattered laser EMR onto a quad-detector. The optical system may convert the target bearing to an irradiance distribution or "spot" positioned on the detector. As the target bearing changes the position of the spot on the detector changes. The quad-detector includes four photoconductive photodiodes that sense whether and to what extent the "spot" is positioned in each quadrant and produce a photocurrent signal accordingly. When the spot is centered on the detector, the photodiodes produce photocurrent signals that are essentially equal.

The SAL seeker must be periodically tested to ensure that the quad-detector is working and working properly. This is commonly referred to as a Built-In Test (BIT). The current state-of-the art is to include an additional laser diode as part of the seeker that emits a beam that scatters off of the optical system. The detector looks for and processes the backscatter off of the optical system to test the photoconductive photodiodes. This approach requires an additional piece of hardware in the laser diode, which introduces another failure mode, requires that the processing algorithms be adapted for the backscattered light as opposed to light reflected off the target and provides only limited BIT capability.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a Built-In Test (BIT) for a photoconductive photodiode without the use of an additional laser diode.

This is accomplished by using the health or characteristics of the photodiode's parasitic capacitance as a "proxy" for the health or characteristics of the photodiode itself A failure or degradation of the photodiode manifests as a similar failure or degradation of the parasitic capacitance. Under normal operating conditions, the photoconductive photodiode responds to incident photons from a target by generating a photocurrent signal at its cathode. A transimpedance stage converts the photocurrent signal to a voltage signal. A processor processes the voltage signals from one or more photodiodes to evaluate characteristics of the target. To perform the BIT, a time-varying voltage signal such as a pulse is applied at the photodiode's anode. This signal is coupled through the parasitic capacitance to induce a test current signal at the photodiode's anode. The transimpedance stage converts the test current signal to a test voltage signal that is supplied to the processor to evaluate the health or characteristics of the photodiode.

In an embodiment, a BIT circuit comprises a solid-state switch and a circuit element such as a capacitor or transformer. The switch is responsive to a control signal to produce a time-varying voltage signal that is coupled through the circuit element into the photodiode's bias network. This time-varying voltage signal is coupled through the parasitic capacitor between the photodiode's anode and cathode to induce a test current signal at the photodiode's cathode. The processor processes the voltage signal produced by the test current signal to provide a measure of the health or characteristics of the parasitic capacitor as a proxy for the health or characteristics of the photodiode. In an embodiment, the control signal is a voltage pulse that is produced in response to a logic signal from the processor. The processor may control the duration of the voltage pulse to shape the amplitude of the test current pulse. The processor may issue a sequence of pulses to shape the test current pulse. Pulse shaping may be used, for example, so that the processor can implement the same detection algorithms to detect return pulses off a target and the test pulses. Pulse shaping may also be used to emulate various detection scenarios to develop the detection algorithms. A single BIT circuit may be used to simultaneously text a plurality of photoconductive photodiodes connected in parallel between a common anode and their respective cathodes.

In an embodiment, a detector comprises a photodiode reverse-biased to operate in a photoconductive mode in which incident photons on the photodiode produce a current signal at the photodiode's cathode, a transimpedance stage that converts the current signal to a voltage signal and a processor that processes the voltage signal to characterize the photons incident on the photodiode. A built-in test (BIT) circuit comprises a capacitor having a first side coupled to the photodiode's anode and a second side, a MOSFFET device having a gate, a first contact coupled to the second side of the capacitor and a third contact coupled to a first reference voltage and a resistor coupled between the first contact and a second reference voltage to bias the MOSFET in an off state. The MOSFET device is responsive to a control voltage pulse applied to its gate to switch to an on state for the duration of the pulse. Thus produces a voltage pulse that is coupled through the capacitor to the anode of the photodiode and through a parasitic capacitor between the photodiode's anode and cathode to induce a test current pulse at the photodiode's cathode. The processor processes the voltage signal produced by the test current pulse to provide a measure of the health or characteristics of the parasitic capacitor as a proxy for the health or characteristics of the photodiode.

In an embodiment, a detector for use with a pulsed laser (such as a SAL seeker) that illuminates a target comprises a plurality of photodiodes in an array reverse-biased between a common anode at a negative bias voltage and respective cathodes at positive bias voltages to operate in a photoconductive mode in which incident photons from a pulsed laser spot reflected off the target onto the array of photodiodes produce photocurrent pulses at the photodiodes' cathodes, a like plurality of transimpedance stages that convert the respective photocurrent pulses to respective voltage pulses and a processor that processors the voltage pulses to compute the position of the laser spot on the array to provide a bearing to a target. A built-in test (BIT) circuit comprises a circuit element coupled to the photodiodes' common anode and a solid-state switch coupled to the circuit element. The switch is responsive to a test pulse to produce a voltage pulse that is coupled through the circuit element to the common anode and through respective parasitic capacitors between each photodiode's anode and cathode to induce test current pulses at the photodiodes' cathodes. The processor processes the plurality of voltage pulses produced by the test current pulses to provide a measure of the health or characteristics of the parasitic capacitors as proxies for the health or characteristics of the photodiodes. The processor may control the duration of the test pulse to shape the amplitude of the test current pulses. The processor may be configured to produce test current pulses that resembles current pulses produced by the pulsed laser spot to allow the processor to implement the same detection algorithms to recognize and process both operation and test pulses.

These and other features and advantages of the invention will be apparent to those skilled in the art from the following detailed description of preferred embodiments, taken together with the accompanying drawings, in which:

DETAILED DESCRIPTION OF THE INVENTION

The present invention describes a Built-In Test (BIT) for a photoconductive photodiode. The BIT is performed using the health or characteristics of the photodiode's parasitic capacitance as a "proxy" for the health or characteristics of the photodiode itself A failure or degradation of the photodiode manifests as a similar failure or degradation of the parasitic capacitance. Under normal operating conditions, the photoconductive photodiode responds to incident photons from a target by generating a photocurrent signal at its cathode. A processor processes the signals from one or more photodiodes to evaluate characteristics of the target. To perform the BIT, a time-varying voltage signal is applied at the photodiode's anode. This signal is coupled through the parasitic capacitance to induce a test current signal at the photodiode's anode according to $I=CdV/dt$. The processor processes the signal to evaluate the health or characteristics of the parasitic capacitance and thus the photodiode. It will be understood by those skilled in the art that reference to the "processor" may encompass one or more processors and computer devices (e.g. memory elements). The BIT may and preferably will be processed by the same processor(s) that handle tactical operations.

Referring now to the figures, embodiments of the invention will be described without loss of generality for an AC coupled circuit in which the photoconductive photodiode is configured to detect changes in incident photon levels (e.g. AC). Examples of AC coupled systems may include a semi-active laser (SAL) receiver configured to detect a return signature of a pulsed laser beam off of a target or a security system in which a senses laser beam is broken. The BIT circuit may be adapted for DC coupled systems to detect absolute photon levels.

Figure 1:
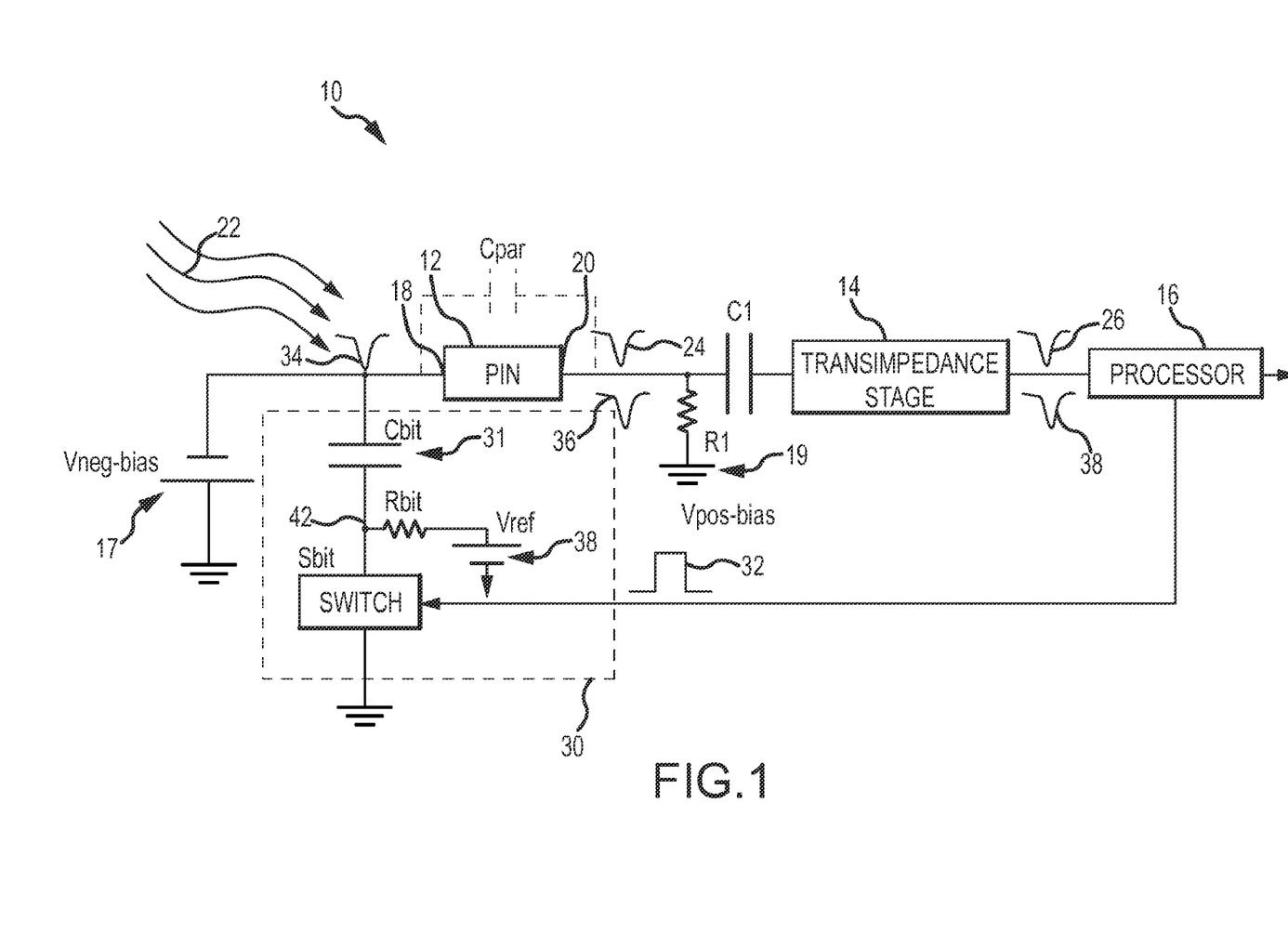
FIG. 1 is a diagram of a photoconductive photodiode and an embodiment of BIT circuit using a capacitor to couple the test pulse into the photodiode's bias network.

As shown in FIG. 1, in an embodiment a detector 10 comprises a photodiode 12, a transimpedance (I/V) stage 14 and a processor 16. A voltage source 17 supplies a negative bias voltage Vneg-bias that is coupled to the detector's anode 18 and a voltage source 19 supplies a positive bias voltage Vpos-bias (suitably ground potential) that is coupled through a bias resistor R1 to the detector's cathode 20. The photodiode is AC-coupled via a capacitor C1 to the transimpedance stage 14.

Reverse biasing the photodiode causes it to operate in the photoconductive mode. The reverse bias increases the width of the depletion region, which decreases the junction's capacitance resulting in faster response time. When a photon 22 of sufficient energy strikes the diode, the photon excites an electron, thereby creating a mobile electron a positive charged electron hole. If the absorption occurs in the junction's depletion region, or within one diffusion length of the depletion region, these carriers are swept away from the junction by the built-in field of the depletion region. Thus holes move toward the anode and electrons towards the cathode and a photocurrent 24 is produced. The photocurrent 24 produced at cathode 20 is linearly proportional to the incident light. As shown the "pulse" of photocurrent 24 may be a return signature off a target from a pulsed laser source. Transimpedance stage 14 converts photocurrent 24 into a voltage signal 26.

Processor 16 processes the voltage signal 26 to characterize the photons incident on the photodiode. The photons may be passively emitted by the target or reflected off the target from an active source such as a pulsed laser. The processor may process the signals to determine, for example, a bearing to the target, a range to target or a target image to perform target identification or aimpoint selection. The processor may process signals to determine if a beam has been interrupted in, for example, a security system. Photoconductive photodiodes are used in a wide array of applications.

A BIT circuit 30 is responsive to a control signal 32 (test pulse) such as a switched logic pulse 0/1 from processor 16 to apply a time-varying voltage signal 34 at the photodiode's anode 18. This signal is coupled through the photodiode's parasitic capacitance Cpar to induce a test current signal 36 (test current pulse) at the photodiode's anode 20. The transimpedance stage converts the test current signal 36 to a test voltage signal 38 (test voltage pulse) that is supplied to the processor 16 to evaluate the health or characteristics of the parasitic capacitance as a proxy for the health or characteristics of the photodiode. The photodiode itself does not respond to the modulation of its anode voltage to produce a photocurrent. The test is purely a result of coupling the voltage signal through the parasitic to induce a test current signal at the cathode.

Processor 16 may, for example, compare the measured test voltage signal 38 to a calibrated test voltage signal stored in processor memory. The calibrated signal being generated off line by the BIT circuit when the photodiode was verifiable healthy and working properly. The processor may use this to signal the onset of degradation or to signal a failure mode. Alternately, the BIT circuit may be configured to simultaneously test multiple photodiodes connected at a common anode. The processor may compare the response of each photodiode to its calibrated response and/or compare the responses to each other to assess whether one or more of the photodiodes has degraded or failed.

The BIT circuit may also be used to test the transimpedance stage. For example, in some configurations the transimpedance stage may comprise multiple stages corresponding to different current levels with each stage having amount of gain, high amplitude stages typically having less gain and vice-versa. The processor may control the BIT circuit to generate test current signals that exercise the different gain stages.

The BIT circuit may also be used to generate test current signals to emulate various operational conditions to facilitate algorithm development.

As the processor knows precisely when the BIT was initiated, the test may be performed either offline or when operational. Depending upon the application, the BIT circuit 30 and control signal 32 may be configured to produce a test current signal 36 that resembles the operation current signal 24. This may allow the processor to use the same algorithms to detect and process the operation and BIT signals. In other applications the characteristics (e.g. shape and amplitude) of the operation current signal and test current signal may be quite different and require separate processing.

BIT circuit 30 comprises a circuit element 31 coupled to the photodiode's anode and a solid-state switch Sbit coupled to the circuit element. A voltage source 38 supplies a reference voltage Vref that is suitably coupled to the switch via a bias resistor Rbit to bias the switch to its off state. The other side of the switch is coupled to another reference voltage, suitably ground potential. The switch is responsive to control signal 32 to switch to its on state and produce the time-varying voltage signal 34 that is coupled through the circuit element to the anode of the photodiode. Circuit element 31 may, for example, comprise a capacitor Cbit as show in this embodiment or a transformer as shown in another embodiment in FIG. 2. The circuit element functions to couple the pulse into the bias network of the photodiode, to isolate the switch from the negative bias voltage and to shape the pulse. Other circuit elements may be used that provide these functions. As the AC-coupled system may be sensitive to noise, the control signal 32 may be passed through a pulse initiation circuit (not shown) to remove noise.

As stated previously, control signal 32 may be a switched logic 0/1 pulse issued by processor 16. A "pulse" is easy to generate and detect and can be shaped to resemble a laser pulse. The control pulse 32 may be considered to be an ideal square pulse, its rise and fall times are dictated by the processor's logic circuits and are relatively very fast. As this ideal pulse travels through the BIT circuit 30, the photodiode's parasitic capacitance Cpar, AC coupling capacitor C1 and transimpedance stage 14 the pulse is filtered a little more at each stage by both the discrete elements and their parasitics to the point the pulse may resemble a Gaussian pulse at the photodiode's cathode. If desired, this Gaussian pulse can be shaped via selection of the BIT circuit elements and the control signal to resemble current signal 24 generated by incident photons. The duration of control pulse 32 may also be controlled to vary the amplitude of the test current pulse 36.

More specifically for the BIT circuit configuration shown in FIG. 1 in which the circuit element is a capacitor, switch Sbit is normally biased in its off state. The voltage VSbit at the junction 42 of switch Sbit and capacitor Cbit is Vref and the voltage across Cbit is Vneg-bias-Vref. Upon application of control pulse 32, switch Sbit will switch to its on state pulling the voltage at the junction towards ground potential. The rate at which the voltage is driven to ground potential is dictated by the time constant of the switch. Capacitor Cbit suitably has a longer time constant. To a first order, the voltage across capacitor Cbit holds at its steady-state value as the switch voltage is pulled to ground. As a result, the anode voltage Vanode is pulled down by Vref. To a first order, the anode voltage follows the switch voltage down with additional delay and shaping caused by the additional resistance and capacitance encountered by the signal. This produces the voltage pulse 34 that is coupled through Cpar to create the test current pulse 36 Icathode. When control pulse 32 switches back low switch Sbit switches to it's off state pulling the voltage at the junction back up to Vref thus pulling the anode voltage up by Vref. The anode voltage may initially overshoot the negative bias voltage due to a certain amount of charging of capacitor Cbit. Capacitor Cbit will discharge so that the anode voltage reaches a steady-state condition at Vneg-bias.

Figure 2:
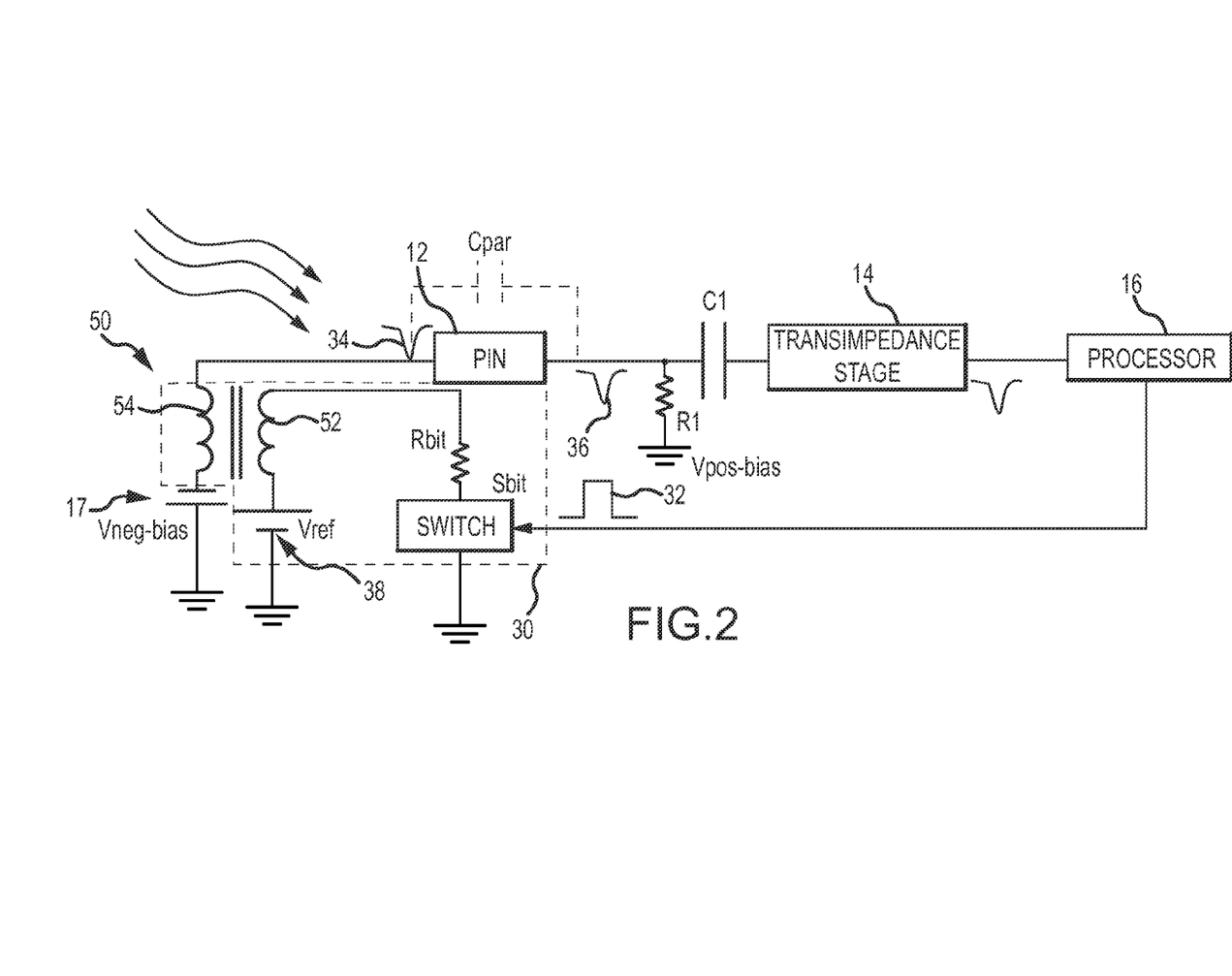
FIG. 2 is a diagram of a photoconductive photodiode and an embodiment of BIT circuit using a transformer to couple the test pulse into the photodiode's bias network.

In another embodiment shown in FIG. 2, BIT circuit 30 comprises a reference voltage Vref, a transformer 50, a bias resistor Rbit and a switch Sbit. The transformer's primary winding 52 is connected in series with Vref source 38, Rbit and Sbit and its secondary winding 54 is connected in series with the photodiode's negative bias voltage source 17 as part of the diode's bias network. Vref and Rbit bias switch Sbit off so that the voltage across switch Sbit is also Vref. There is no DC voltage across either the primary or secondary windings. When switch Sbit switches on in response to control signal 32, the switch voltage is again driven towards ground potential. This induces a voltage across primary winding 52 that is coupled to secondary winding 54 to produce the time-varying voltage 34 at the anode.

As described above, when switch Sbit turns on the voltage across the switch collapses to approximately 0 volts so that the voltage at the top of the switch is driven from Vref towards ground potential. The anode voltage follows this change with a longer time constant due to the additional resistance and capacitance encounter by the signal as it propagates through the BIT circuit and photodiode. From an analog circuitry perspective these time constants are typically quite short, on the order of tens of nanoseconds. However from a perspective of digital logic circuits such time constants are fairly long. Typical digital logic circuits can switch on the order of a nanosecond. This provides an opportunity to use the logic test pulses from the processor to shape the test current pulses.

Figure 3:
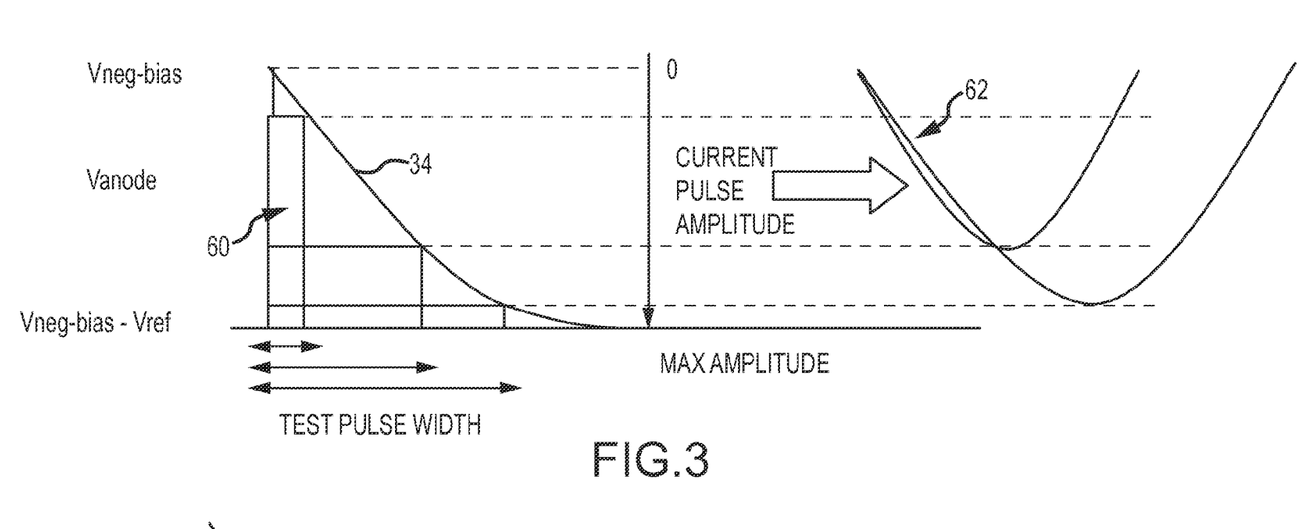
FIG. 3 is a diagram depicting modulation of the duration of the test pulse to control the amplitude of the test current signal.

As shown in FIG. 3, anode voltage Vanode 34 is pulled from its steady-state voltage of Vneg-bias towards Vneg-bias minus Vref at a rate determined by the circuit time constant at the anode. If the duration of a test pulse 60 is sufficiently long, the anode voltage is pulled down by the full reference voltage Vref producing a current pulse 62 of maximum amplitude. When the test pulse is removed, the anode voltage is shifted up by the reference voltage and settles back to the negative bias voltage. The duration of the test pulse required to satisfy this condition is dependent on the particular BIT circuit configuration. As the test pulse generated by the processor's logic circuits traverses the circuit it spread in time to the test pulse 60 depicted here. For example, a 10 ns test pulse from the processor may become a 20 ns test pulse at the anode. If the circuit time constant at the anode is 20 ns this is sufficient to fully shift the anode voltage.

The opportunity to shape the current pulses 62, and specifically the amplitude of the pulses, is realized by selectively reducing the duration of test pulse 60 with respect to the circuit time constant to limit how far the anode voltage is pulled down. The shorter the pulse width the smaller the induced voltage, hence the smaller the test current pulse. Therefore, the processor can vary the duration of the test pulse with respect to the circuit time constant to vary the amplitude of the current signal. This may be useful to shape the test pulse so that it resembles current pulses generated by normal operation of the photodiode in order to utilize the same detection algorithms or to shape the test pulse in order to test different gain stages of the transimpedance stage.

Because the rise time is set by the circuit time constant and the rise time of the logic pulse, changing the amplitude also has the effect of changing the duration of the test current pulse. In order to depict pulse-width modulation of the test pulses to control the amplitude of the test current pulse the time scale has been expanded dramatically. In practice the effect is substantially subtler. For example, in a particular embodiment the pulse width at the cathode may vary by a few nanoseconds. Note, the BIT circuit could be provided with a variable RC circuit to provide a measure of control over the rise time and shape of the induced current pulse.

Another possibility is to set the duration of the test pulse to be greater than the circuit time constant. In this case, the anode voltage is shifted down by Vreg and the switch remains in its on state for some period of time. During this period, the capacitor Cbit charges up as the anode voltage returns to its steady-state negative bias voltage. The test current spikes to a negative value and the bleeds back to a quiescent level of approximately zero. When the switch switches to its off state, the anode voltage is shifted up by Vref inducing a positive current spike. The anode voltage and current bleed back to their steady-state levels as the capacitor discharges.

Figure 4:
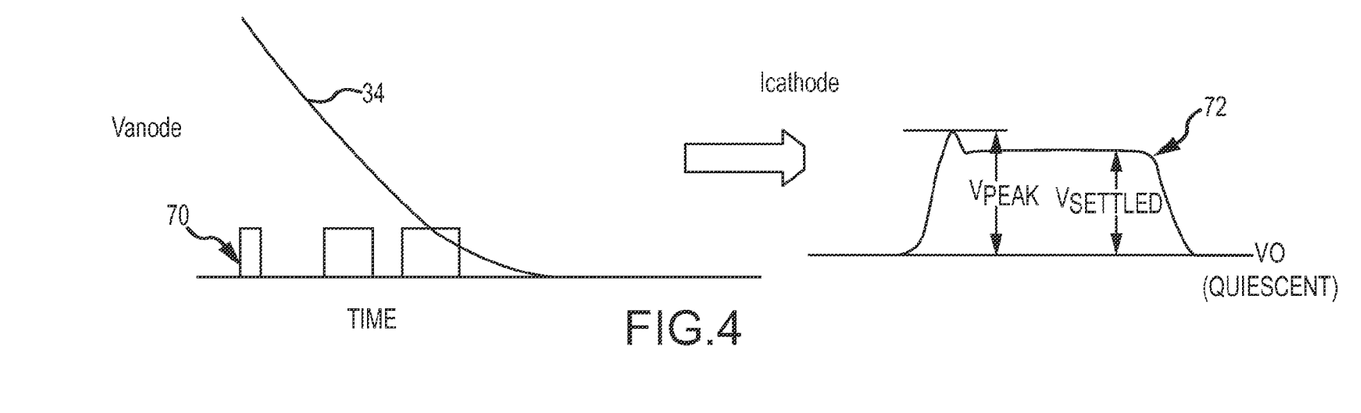
FIG. 4 is a diagram depicting a sequence of test pulses to shape a single test current pulse.

As shown in FIG. 4, anode voltage Vanode 34 is pulled from its steady-state voltage of Vneg-bias towards Vneg-bias minus Vref at a rate determined by the circuit time constant at the anode. In this embodiment, the processor issues a sequence of relatively short pulses 70 that interact with the circuit time constant to induce a single current pulse 72 at the photodiode's cathode. The number, spacing and individual durations of the pulses 70 can be selected to shape the single current pulse 72. This may be useful to shape the test current pulse to more closely resemble real current signals produced by the photodiode during tactical operations in order to use the same detection algorithms. This may also be useful to produce various current pulse or signal shapes representative of different tactical scenarios to facilitate algorithm development.

Figure 5A:
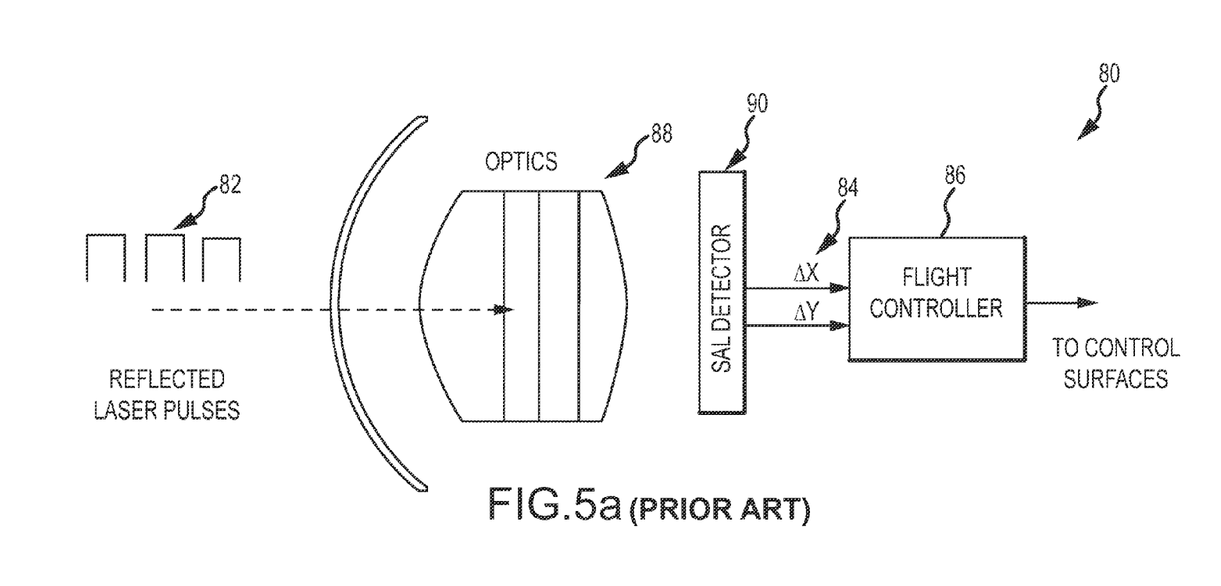
FIGS. 5a and 5b are diagrams of a semi-active laser (SAL) seeker and its quad-detector of four photoconductive photodiodes in a quadrature arrangement.
Figure 5B:
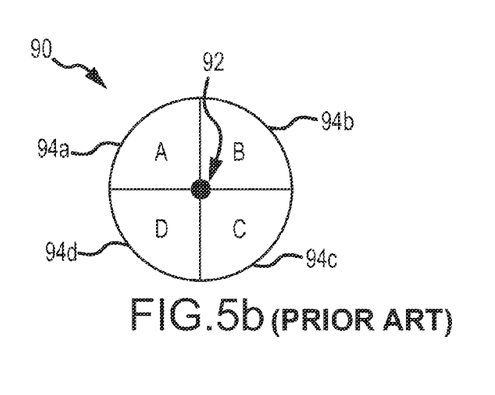

As described earlier, one use of photoconductive photodiodes is within a semi-active laser (SAL) seeker 80 as shown in FIGS. 5a and 5b to detect pulsed laser electro-magnetic radiation (EMR) 82 scattered from an intended target to provide signals 84($\Delta X, \Delta Y$) indicative of target bearing. A flight controller 86 processes the signals to generate signals to control aerodynamic surfaces (e.g. fins, canards, etc.) to guide a projectile (e.g. laser guided artillery shell, guided missile or guided bomb) to the target.

The SAL may include an optical system 88 to capture and focus the scattered laser EMR 82 onto a SAL detector 90 such as a quad-detector. The optical system may convert the target bearing to an irradiance distribution or "spot" 92 positioned on the detector. As the target bearing changes the position of the spot on the detector changes. The quad-detector includes four photoconductive photodiodes that sense whether and to what extent the "spot" is positioned in each quadrant and produce a photocurrent signal accordingly. When the spot is centered on the detector, the photodiode produce current signals that are essentially equal. Note, more sophisticated detectors in 4×4 and 8×8 configurations are under development to provide more precise bearing measurements.

More specifically, detector 90 may comprise four quadrants A, B, C, D as shown in FIG. 5b. Each quadrant comprises a photoconductive photodiode 94a, 94b, 94c and 94d that produce a corresponding photocurrent signal A, B, C, and D in response to the laser power incident upon each quadrant. Guidance signal $\Delta X$ may indicate an imbalance between the laser power incident upon the left (quadrants A and B) and right (quadrants C and D) halves of the detector. Guidance signal $\Delta Y$ may indicate an imbalance between the laser power incident upon the top (quadrants A and C) and bottom (quadrants B and D) halves of the detector. The terms "left", "right", "top", and "bottom" refer to the detector as shown in FIG. 5b and do not imply any physical orientation of the detector within a projectile. When the laser spot 92 is centered on the detector, the signals A, B, C, D may be essentially equal and the guidance signals $\Delta X$ and $\Delta Y$ may both be zero or nearly zero.

Figure 6:
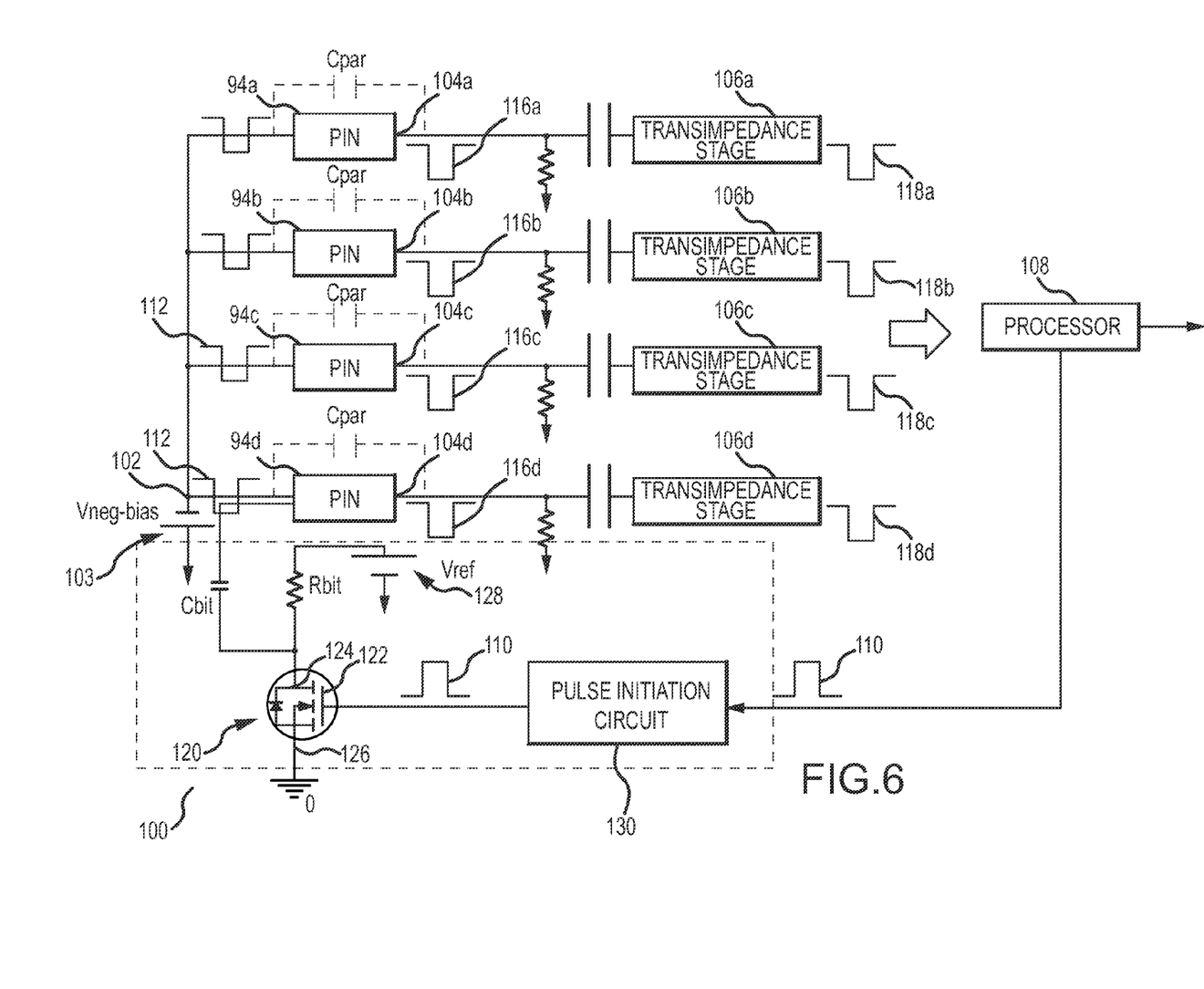
FIG. 6 is a diagram of the quad-detector and a BIT circuit.

As shown in FIG. 6, a single BIT circuit 100 may be configured to simultaneously test all four channels of the SAL detector. The four photodiodes 94a, 94b, 94c and 94d are connected between a common anode 102 coupled to a voltage source 103 that supplies negative bias voltage Vneg-bias and respective cathodes 104a, 104b, 104c and 104d coupled to sources of a positive bias voltage (e.g. ground potential). The photodiodes are reverse biased to operate in a photoconductive mode in which incident photons from pulsed laser spot 92 induce photocurrent pulses at the photodiodes' cathodes. A like plurality of transimpedance stages 106a, 106b, 106c and 106d convert the respective photocurrent pulses to respective voltage pulses. A processor 108 processes the voltage pulses to compute the position of the laser spot on the array to provide signals $\Delta X, \Delta Y$ to the flight controller.

BIT circuit 100 is responsive to a test pulse 110 from the processor to produce a voltage pulse 112 that is coupled to the common anode 102 and through respective parasitic capacitors between each photodiode's anode and cathode to induce test current pulses 116a, 116b, 116c and 116d at the photodiodes' cathodes. The processor processes the plurality of voltage pulses 118a, 118b, 118c and 118d produced by the test current pulses to provide a measure of the health or characteristics of the parasitic capacitors as proxies for the health or characteristics of the photodiodes. The processor may control the duration of the test pulse to shape the amplitude of the test current pulses. The processor may be configured to produce test current pulses that resembles current pulses produced by the pulsed laser spot to allow the processor to implement the same detection algorithms to recognize and process both operation and test pulses.

In this embodiment, BIT circuit 100 comprises an N-channel MOSFET device 120 having a gate 122, a source 124 and a drain 126 coupled to ground potential. A capacitor Cbit is connected between source 124 and common anode 102. A voltage source 128 supplies a positive reference voltage Vref through a bias resistor Rbit to source 124 to bias the MOSFET device 120 so that it will act as a switch. Without Rbit and the positive Vref input, the switching transistor would be always "on" or always "off" depending on the type of transistor. For the N-channel MOSFET switch, the source of the NMOSFET would be at the potential of the negative bias voltage causing the source-drain diode remain on. If a P-channel MOSFET were used instead, the drain-source voltage would always be greater than the gate-source voltage meaning the device would be in a constant off state. A pulse initiation circuit 130, a network of resistors and capacitors and possibly a transformer, may be included to filter any noise.

In a logic low state, the N-channel MOSFET is turned off. The device's source voltage is fixed at the positive reference voltage Vref. When the processor switches test pulse 110 to a logic high state, the MOSFET device switches to its on state. The source voltage is pulled toward ground potential pulling current from voltage source 128 through bias resistor Rbit. This pulls the voltage at common anode 102 down producing the voltage pulse 112 that is coupled to each photodiode to simultaneously produce test current pulses 116a, 116b, 116c and 116d in the four channels.

Figure 7A:
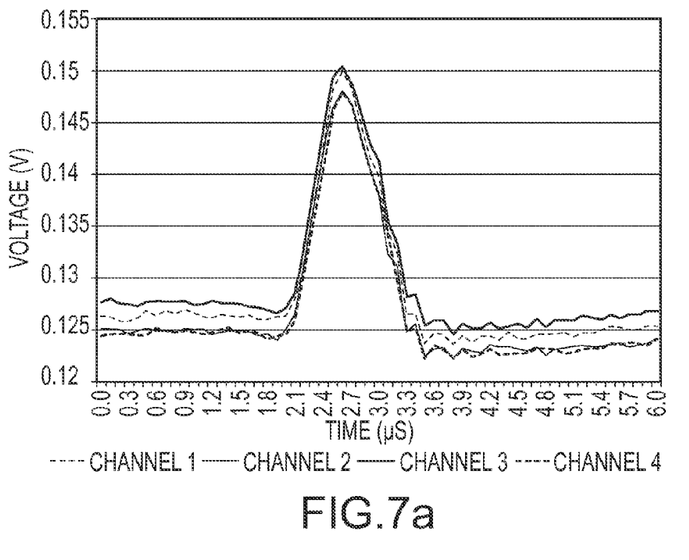
FIGS. 7a and 7b are plots of the test voltage signals for the quad-detector.
Figure 7B:
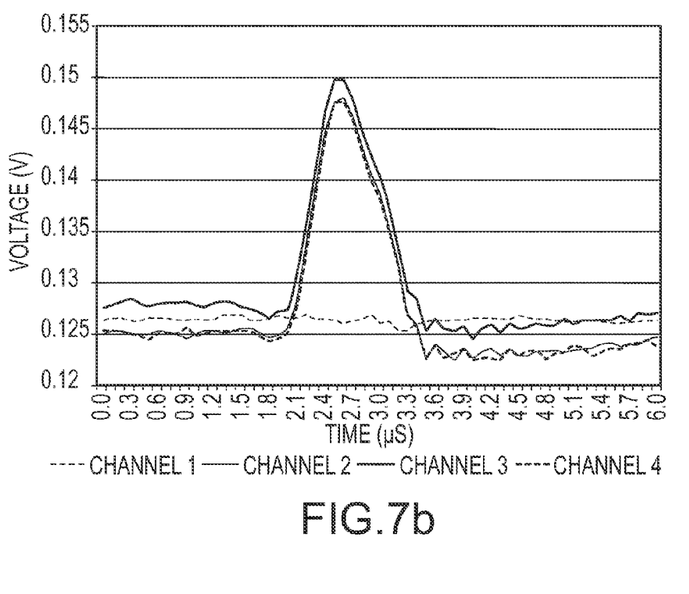

As shown in FIGS. 7a and 7b, in response to a single test pulse the BIT circuit induces four voltage pulses in the four channels. As shown in FIG. 7a, the four voltage pulses are closely matched. This indicates that al four channels are functioning and functioning properly. In addition, the processor may compare the voltage pulse for each channel to a calibrated voltage pulse stored in memory. As shown in FIG. 7b, one of the channels has failed as no pulse was induced by the test pulse.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A detector, comprising:
   a photodiode reverse-biased to operate in a photoconductive mode in which incident photons on the photodiode produce a photocurrent signal at the photodiode's cathode;
   a transimpedance stage that converts the photocurrent signal to a voltage signal;
   a processor that processes the voltage signal to characterize the photons incident on the photodiode; and
   a built-in test (BIT) circuit comprising:
      a circuit element coupled to the photodiode's anode;
      a solid-state switch coupled to the circuit element, said switch responsive to a control signal to produce a time-varying voltage signal that is coupled through the circuit element to the anode of the photodiode and through a parasitic capacitor between the photodiode's anode and cathode to produce a test current signal at the photodiode's cathode,
   said processor processing the voltage signal produced by the test current signal to provide a measure of the health or characteristics of the parasitic capacitor as a proxy for the health or characteristics of the photodiode.

2. The detector of claim 1, wherein a calibrated voltage signal is stored in the processor, said processor comparing the BIT voltage signal to the calibrated voltage signal to measure the health or characteristics of the photodiode.

3. The detector of claim 1, wherein said transimpedance stage has different gain stages corresponding to different photocurrent signal amplitudes, said processor varying said control signal to produce test current signals of different amplitudes to test each of the different gain stages.

4. The detector of claim 3, wherein said detector is characterized by a circuit time constant and said control signal is a voltage pulse, said processor varying the duration of the voltage pulse with respect to the circuit time constant to vary the amplitude of the test current signal.

5. The detector of claim 1, wherein said detector is characterized by a circuit time constant, said control signal is a control voltage pulse and said test current signal is a test current pulse, said processor varying the duration of the control voltage pulse with respect to the circuit time constant to set the amplitude of the test current pulse.

6. The detector of claim 1, wherein said detector is characterized by a circuit time constant, said control signal is a voltage pulse having a rise time and said test current signal is a test current pulse, said rise time of the voltage pulse interacting with the circuit time constant to establish the rise time and shape of the test current pulse.

7. The detector of claim 1, wherein said detector is characterized by a circuit time constant, said control signal is a voltage pulse and said test current signal is a test current pulse, said processor applying a plurality of voltage pulses to the solid-state switch within the circuit time constant to shape one said test current pulse.

8. The detector of claim 1, wherein said detector is configured to receive a return signature of a laser pulse off of a target, said processor configured to implement detection algorithms to recognize and process photocurrent pulses associated with the return signature, wherein said BIT circuit produces a test current pulse that resembles those photocurrent pulses so that the processor uses the same detection algorithms to perform the BIT.

9. The detector of claim 8, wherein the BIT circuit produces a test current pulse that closely approximates the photocurrent pulse produced by directly illuminating the photodiode with the laser pulse.

10. The detector of claim 1, wherein a plurality of reverse-biased photodiodes that operate in the photoconductive mode are connected in parallel between a common anode at a negative bias voltage and respective cathodes at positive bias voltages, said BIT circuit producing test current signals to simultaneously test the health or characteristics of each said photodiode.

11. The detector of claim 10, wherein the processor compares the test voltage signals of the plurality of photodiodes to each other to assess the health or characteristics of individual photodiodes.

12. The detector of claim 1, wherein in the BIT circuit the circuit element comprises a capacitor or a transformer.

13. The detector of claim 12, wherein the BIT circuit further comprises:

a reference voltage to bias the switch in an off state,
wherein said switch is responsive to the control signal to switch to its on state to produce a voltage signal at the anode having an amplitude of approximately the reference voltage.

14. A detector, comprising:
a photodiode reverse-biased to operate in a photoconductive mode in which incident photons on the photodiode produce a photocurrent signal at the photodiode's cathode;
a transimpedance stage that converts the photocurrent signal to a voltage signal;
a processor that processes the voltage signal to characterize the photons incident on the photodiode; and
a built-in test (BIT) circuit comprising:
  a capacitor having a first side coupled to the photodiode's anode and a second side;
  a MOSFET device having a gate, a first contact coupled to the second side of the capacitor and a third contact coupled to first reference voltage; and
  a resistor coupled between said first contact and a second reference voltage to bias the MOSFET in an off state,
wherein said MOSFET device is responsive to a test voltage pulse applied to its gate to switch to an on state for the duration of the pulse to produce a voltage pulse that is coupled through the capacitor to the anode of the photodiode and through a parasitic capacitor between the photodiode's anode and cathode to produce a test current pulse at the photodiode's cathode,
said processor processing the voltage signal produced by the test current pulse to provide a measure of the health or characteristics of the parasitic capacitor as a proxy for the health or characteristics of the photodiode.

15. The detector of claim 14, wherein the processor controls the duration of the test voltage pulse to set the amplitude of the test current pulse.

16. The detector of claim 15, wherein said detector is configured to receive a return signature of a laser pulse off of a target, said processor configured to implement detection algorithms to recognize and process photocurrent pulses associated with the return signature, wherein said BIT is configured to produce a test current pulse that resembles those photocurrent pulses so that the processor uses the same detection algorithms to perform the BIT.

17. A detector for use with a pulsed laser that illuminates a target, comprising:
a plurality of photodiodes in an array reverse-biased between a common anode at a negative bias voltage and respective cathodes at positive bias voltages to operate in a photoconductive mode in which incident photons from a pulsed laser spot reflected off of the target onto the array of photodiodes produce photocurrent pulses at the photodiodes' cathodes;
a plurality of transimpedance stages that convert the respective photocurrent pulses to respective voltage pulses;
a processor that processes the voltage pulses to compute the position of the laser spot on the array to provide a bearing to a target; and
a built-in test (BIT) circuit comprising:
  a circuit element coupled to the photodiodes' common anode;
  a solid-state switch coupled to the circuit element, said switch responsive to a test voltage pulse to produce a voltage pulse that is coupled through the circuit element to the common anode and through respective parasitic capacitors between each photodiode's anode and cathode to produce test current pulses at the photodiodes' cathodes,
said processor processing the plurality of voltage pulses produced by the test current pulses to provide a measure of the health or characteristics of the parasitic capacitors as proxies for the health or characteristics of the photodiodes.

18. The detector of claim 17, wherein the processor controls the duration of the test voltage pulse to set the amplitude of the test current pulses.

19. The detector of claim 18, wherein said processor is configured to implement detection algorithms to recognize and process photocurrent pulses associated with the pulsed laser spot, said BIT circuit is configured to produce a test current pulse that resembles those photocurrent pulses so that the processor uses the same detection algorithms to perform the BIT.

20. A method of performing a built-in test (BIT) on a photodiode, comprising:
reverse biasing the photodiode to operate in a photoconductive mode in which incident photons on the photodiode produce a photocurrent signal at the photodiode's cathode;
converting the photocurrent signal to a voltage signal;
processing the voltage signal to characterize the photons incident on the photodiode; and
in response to a BIT request,
  applying a time-varying voltage signal at the anode of the photodiode, said time-varying voltage signal coupled through a parasitic capacitor between the photodiode's anode and cathode to produce a test current signal at the photodiode's cathode;
  converting the test current signal to a test voltage signal; and
  processing the test voltage signal to provide a measure of the health or characteristics of the parasitic capacitor as a proxy for the health or characteristics of the photodiode.

* * * * *